(12) United States Patent
Mao et al.

(10) Patent No.: US 12,387,985 B2
(45) Date of Patent: Aug. 12, 2025

(54) SEMICONDUCTOR DEVICE WITH CAVITY CARRIER AND METHOD THEREFOR

(71) Applicant: NXP B.V., Eindhoven (NL)

(72) Inventors: Kuan-Hsiang Mao, Kaohsiung (CN); Zhiwei Gong, Chandler, AZ (US); Neil Thomas Tracht, Paradise Valley, AZ (US)

(73) Assignee: NXP B.V., Eindhoven (NL)

( * ) Notice: Subject to any disclaimer, the term of this patent is extended or adjusted under 35 U.S.C. 154(b) by 522 days.

(21) Appl. No.: 18/048,972

(22) Filed: Oct. 24, 2022

(65) Prior Publication Data
US 2024/0136238 A1    Apr. 25, 2024
US 2024/0234222 A9    Jul. 11, 2024

(51) Int. Cl.
| | |
|---|---|
| *H01L 21/00* | (2006.01) |
| *H01L 21/56* | (2006.01) |
| *H01L 23/00* | (2006.01) |
| *H01L 23/04* | (2006.01) |
| *H01L 23/31* | (2006.01) |
| *H01L 23/538* | (2006.01) |

(52) U.S. Cl.
CPC ............ *H01L 23/041* (2013.01); *H01L 21/56* (2013.01); *H01L 23/3157* (2013.01); *H01L 23/5383* (2013.01); *H01L 24/16* (2013.01); *H01L 2224/16227* (2013.01)

(58) Field of Classification Search
None
See application file for complete search history.

(56) References Cited

U.S. PATENT DOCUMENTS

| | | | | |
|---|---|---|---|---|
| 6,979,594 | B1* | 12/2005 | Fan | H01L 23/4334 |
| | | | | 257/E23.092 |
| 7,208,344 | B2* | 4/2007 | Ho | H01L 23/5389 |
| | | | | 257/E21.503 |
| 7,892,882 | B2* | 2/2011 | Leal | H01L 24/32 |
| | | | | 438/106 |
| 8,922,021 | B2* | 12/2014 | Scanlan | H01L 21/56 |
| | | | | 257/737 |
| 9,449,911 | B1* | 9/2016 | Kim | H01L 24/19 |
| 10,109,564 | B2* | 10/2018 | Groenhuis | H01L 23/49582 |
| 2013/0127044 | A1* | 5/2013 | Poddar | H01L 21/568 |
| | | | | 438/114 |
| 2019/0051608 | A1* | 2/2019 | Sugiyama | H05K 3/4608 |
| 2020/0152557 | A1* | 5/2020 | Lim | H01L 24/24 |
| 2021/0242595 | A1* | 8/2021 | Kim | H01Q 1/2283 |
| 2024/0055397 | A1* | 2/2024 | Raman | H01L 25/0655 |

\* cited by examiner

*Primary Examiner* — Nicholas J Tobergte

(57) ABSTRACT

A method of forming a semiconductor device is provided. The method includes forming a first cavity at a first major surface of a first encapsulant. A first semiconductor die is affixed on the first major surface of the first encapsulant and a second semiconductor die is affixed on a bottom surface of the first cavity. A second encapsulant encapsulates the first semiconductor die, the second semiconductor die, and at least exposed portions of the first major surface of the first encapsulant. A package substrate is formed on a first major surface of the second encapsulant. The package substrate includes conductive traces interconnected to the first semiconductor die and the second semiconductor die.

20 Claims, 7 Drawing Sheets

SEMICONDUCTOR DEVICE WITH CAVITY CARRIER AND METHOD THEREFOR

BACKGROUND

Field

This disclosure relates generally to semiconductor device packaging, and more specifically, to semiconductor devices with a cavity carrier and method of forming the same.

Related Art

Today, there is an increasing trend to include sophisticated semiconductor devices in products and systems that are used every day. These sophisticated semiconductor devices may include features for specific applications which may impact the configuration of the semiconductor device packages, for example. For some features and applications, the configuration of the semiconductor device packages may be susceptible to lower reliability, lower performance, and higher product or system costs. Accordingly, significant challenges exist in accommodating these features and applications while minimizing the impact on semiconductor devices' reliability, performance, and costs.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a multi-die semiconductor device with a cavity carrier. The semiconductor device includes a plurality of semiconductor die encapsulated by way of a dual encapsulation process. A first encapsulant of the dual encapsulation process is formed from a substantially rigid material such as a cured epoxy molding compound, glass, quartz, or ceramic. One or more cavities are formed in the first encapsulant creating a die cavity carrier. The one or more cavities serve as die attachments sites along with a die attachment site located at the major surface of the cavity carrier. Each of the one or more cavities is formed to a predetermined depth such that after a plurality of semiconductor die are attached to respective die attachment sites, active surfaces of the of the plurality of semiconductor die are substantially coplanar. A second encapsulant of the dual encapsulation process encapsulates the plurality of semiconductor die and exposed portions of the first encapsulant of the cavity carrier. Here, the second encapsulant together with the first encapsulant provide a dual encapsulation encasing the plurality of semiconductor die. Conductive die connectors attached to die pads of the plurality of semiconductor die are expose through the second encapsulant by way of a grind operation. An interconnecting package substrate is applied on the second encapsulant and conductively connected the exposed die connectors. By forming the semiconductor device in this manner, a plurality of semiconductor die with various thickness can be accommodated.

Figure 1:
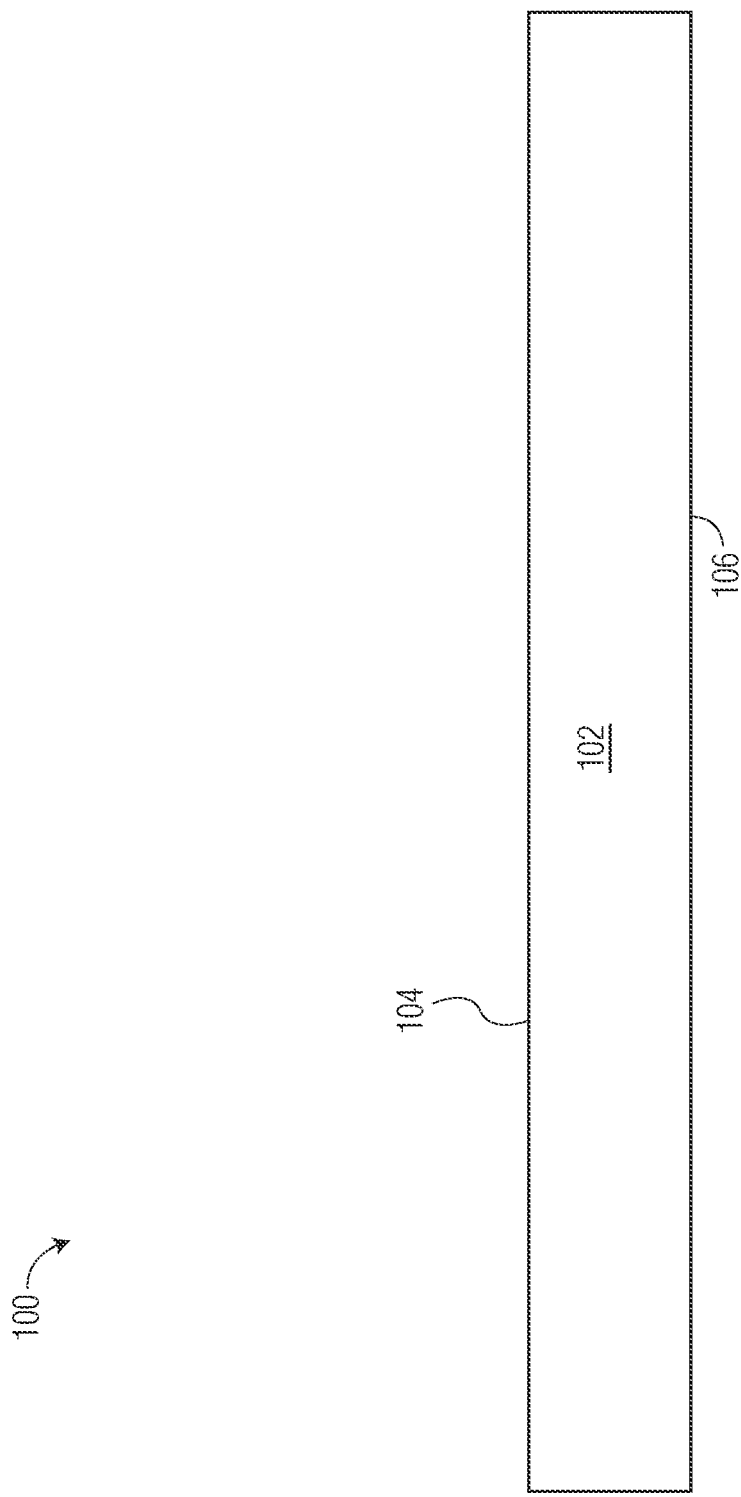
FIG. 1 through FIG. 7 illustrate, in simplified cross-sectional views, an example semiconductor device having a pre-mold cavity carrier at stages of manufacture in accordance with an embodiment.

FIG. 1 illustrates, in a simplified cross-sectional view, an example semiconductor device 100 having a cavity carrier at a stage of manufacture in accordance with an embodiment. At this stage of manufacture, the semiconductor device 100 includes a first encapsulant 102 formed as a blank (e.g., no features). The blank encapsulant 102 may be in the form of a panel configured for assembly of a plurality of semiconductor devices 100 at a subsequent stage, for example. In this embodiment, the encapsulant 102 is a cured epoxy molding compound having a first major surface 104 and a second major surface 106. Alternatively, the blank encapsulant 102 may be formed from sufficiently rigid encapsulant materials such as glass, quartz, or ceramic.

Figure 2:
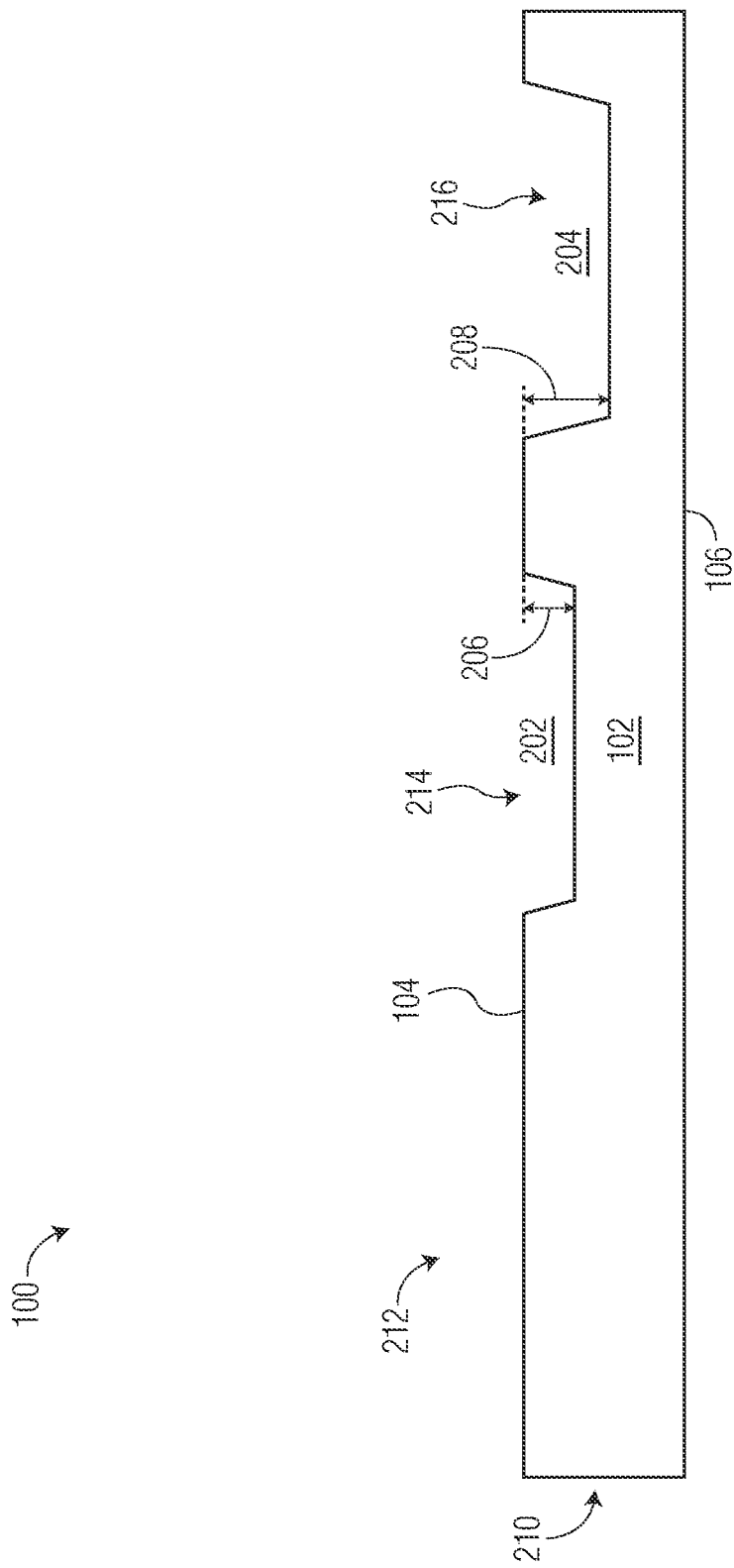

FIG. 2 illustrates, in a simplified bottom-side-up cross-sectional view, the example semiconductor device 100 at a subsequent stage of manufacture in accordance with an embodiment. At this stage of manufacture, the semiconductor device 100 includes a first cavity 202 and a second cavity 204 formed in the first encapsulant 102. The blank encapsulant 102 is selectively etched by way of chemical etching or laser ablation, for example, to form the cavities 202 and 204. In this embodiment, the cavity 202 is formed having a predetermined first depth dimension 206 and the cavity 204 is formed having a predetermined second depth dimension 208. The first depth dimension 206 is measured from the first major surface 104 to a bottom surface of the cavity 202 and the second depth dimension 208 is measured from the first major surface 104 to a bottom surface of the cavity 204. In this embodiment, the second depth dimension 208 is larger than the first depth dimension 206. The cavities 202 and 204 may be patterned and formed using traditional masking and exposure techniques. For example, the cavities 202 and 204 may be formed using known gray-scale masking and lensing exposure techniques to limit the depth of each cavity region such that the depth dimension 206 of the cavity 202 and the depth dimension 208 of the cavity 204 may be different. In this embodiment, the cavities 202 and 204 are patterned and etched during a same process operation. In some embodiments, the cavity 202 may be formed in a process operation different from that of the cavity 204 formation. In some embodiments, the cavities 202 and 204 may be formed during a same molding operation of the encapsulant 102 by way of a customized mold tooling such as a mold chase which includes protruded features for forming the cavities.

In this embodiment, the selectively etched encapsulant 102 is configured as a cavity carrier 210 having a plurality of die attachment sites 212-216. A first die attachment site 212 is located at the first (e.g., top) major surface 104 of the encapsulant 102. A second die attachment site 214 is located at the bottom surface of the cavity 202 and a third die attachment site 216 is located at the bottom surface of the cavity 204. In this embodiment, the plurality of die attachment sites 212-216 is configured and arranged for attachment of a corresponding plurality of semiconductor die at a subsequent stage of manufacture. The number and arrangement of die attachment sites having various depths are chosen for illustration purposes. In this embodiment, the cavity carrier 210 serves as a first part of the dual encapsulation process. Because the cavity carrier 210 (and first part of the dual encapsulation) is formed from a cured epoxy molding compound, glass, quartz, or ceramic materials, for example, the semiconductor device 100 is much less susceptible to warpage at subsequent stages of manufacture. The cavity carrier 210 illustrated in FIG. 2 depicts a singulated semiconductor device portion, for example.

Figure 3:
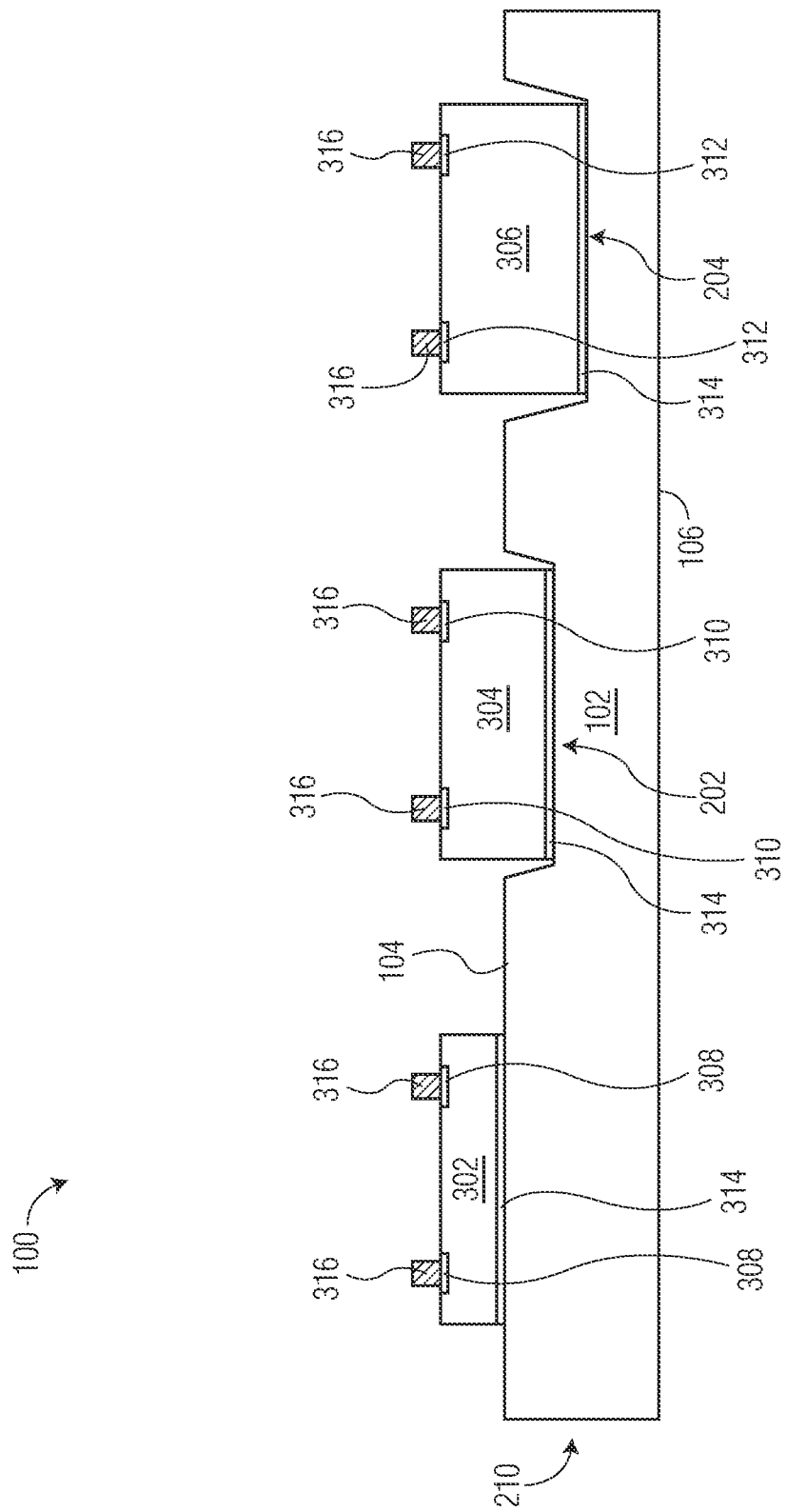

FIG. 3 illustrates, in a simplified bottom-side-up cross-sectional view, the example semiconductor device 100 at a subsequent stage of manufacture in accordance with an embodiment. At this stage of manufacture, the semiconductor device 100 includes a plurality of semiconductor die (302-306) affixed to respective die attachment sites 212-216 depicted in FIG. 2. In this embodiment, a first semiconductor die 302 is attached at the major surface 104 of the encapsulant 102. A second semiconductor die 304 is attached at the bottom surface of the cavity 202 and a third semiconductor die 306 is attached at the bottom surface of the cavity 204. Each of the semiconductor die 302, 304, and 306 is attached to its respective die attachment site by way of a die attach material 314. The die attach material 314 may be in the form of a dispensed die attach adhesive or an applied die attach film, for example. In this embodiment, it may be desirable for the die attach material 314 to have a predetermined thickness.

Each semiconductor die 302, 304, and 306 has an active side (e.g., major side having circuitry) and a backside (e.g., major side opposite of the active side). Each semiconductor die 302, 304, and 306 includes respective die pads 308, 310, and 312 formed at the active side. Die pads 308-312 may be configured for connection to conductive traces of a package substrate formed at a subsequent stage, for example. In this embodiment, conductive die connectors 316 are formed or otherwise attached to die pads 308-312 of the semiconductor die 302-306 to facilitate interconnection with the subsequently formed package substrate. The term "conductive," as used herein, generally refers to electrical conductivity unless otherwise described. The die connectors 316 may be in the form of a stud bumps, copper pillars, or the like, for example. Each semiconductor die 302-306 may be formed from a suitable semiconductor material, such as silicon, germanium, gallium arsenide, gallium nitride, and the like. Each semiconductor die 302-306 may further include digital circuits, analog circuits, RF circuits, power circuits, memories, processors, the like, and combinations thereof at the active side.

In this embodiment, each of the semiconductor die 302, 304, and 306 has a unique die thickness. For example, the semiconductor die 302 has a first thickness and the semiconductor die 304 has a second thickness which is greater (e.g., thicker) than the first thickness. The semiconductor die 306 has a third thickness which is greater than the second thickness. In this embodiment, the cavities 202 and 204 of the cavity carrier 210 are formed to predetermined depths that accommodate the different die thicknesses of semiconductor die 304 and 306 in a manner that allows the active sides of the semiconductor die 302, 304, and 306 to be substantially coplanar with one another when attached to the cavity carrier 210. In this embodiment, the cavity carrier 210, being formed with a rigid material (e.g., cured epoxy molding compound), is configured to help hold the semiconductor die 304 and 306 in the place with improved alignment accuracy during a second encapsulation step at a subsequent stage of manufacture, for example.

Figure 4:
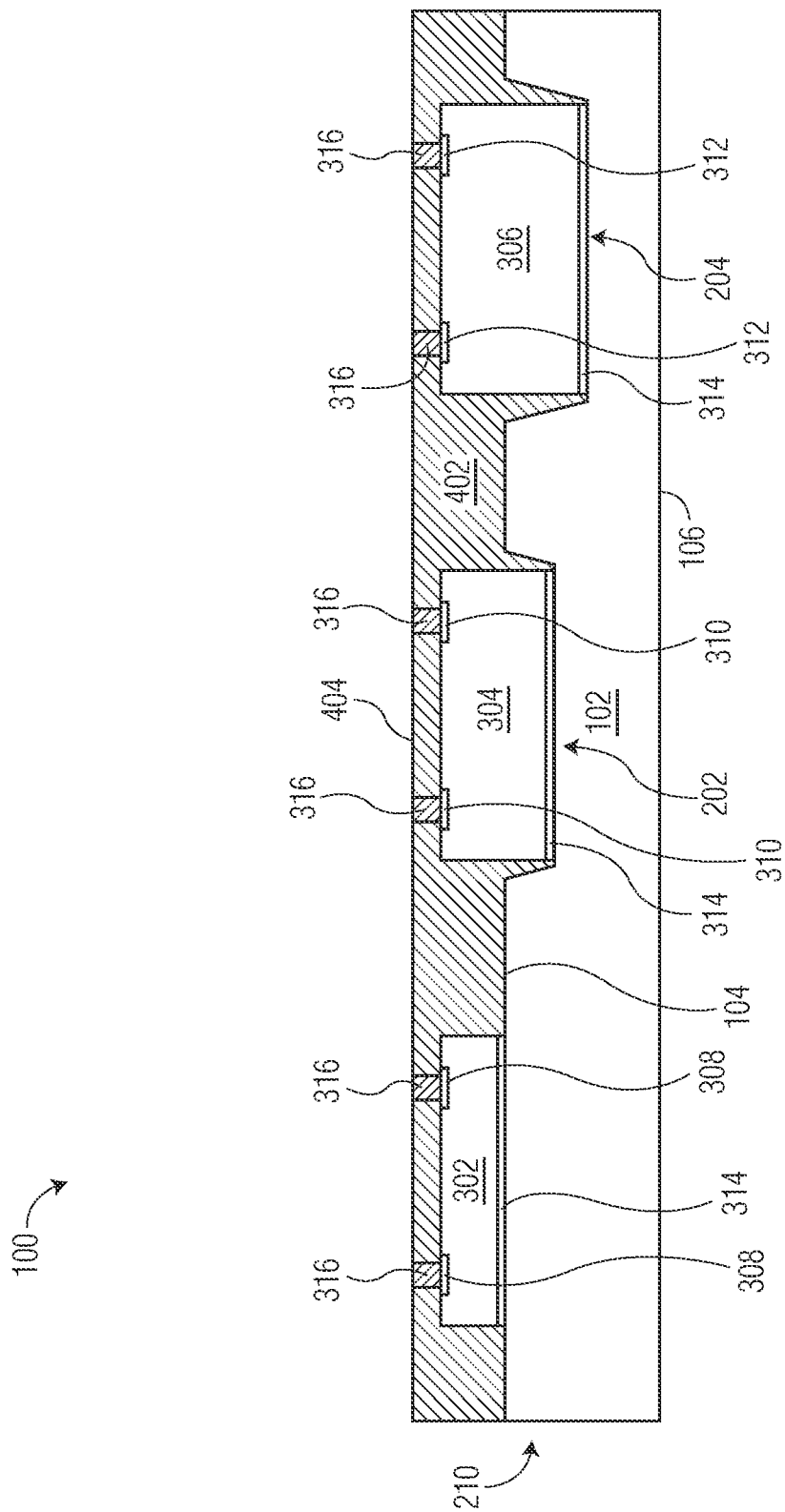

FIG. 4 illustrates, in a simplified bottom-side-up cross-sectional view, the example semiconductor device 100 at a subsequent stage of manufacture in accordance with an embodiment. At this stage of manufacture, the semiconductor device 100 includes the semiconductor die 302, 304, and 306 and at least exposed portions of the major surface 104 of the cavity carrier 210 are encapsulated with a second encapsulant 402. Here, the second encapsulant serves as a second part of the dual encapsulation process. In this embodiment, the semiconductor die 302, 304, and 306 and the major surface 104 of the cavity carrier 210 are overmolded with the encapsulant 402 by way of a molding process.

The dual encapsulated semiconductor device 100 is then subjected to a grind operation to expose portions of the conductive die connectors 316 at the major side 404 of the encapsulant 402. Alternatively, the semiconductor die 302, 304, and 306 and the major surface 104 of the cavity carrier 210 may be molded with the encapsulant 402 by way of a film-assisted molding (FAM) process. For example, a FAM tool using a conformal film may be engaged with predetermined portions of the die connectors 316 during the molding process to keep the predetermined portions free from encapsulant. In this manner, portions of the die connectors 316 may be exposed at the major surface 404 of the encapsulant 402 without a grind operation.

In this embodiment, the encapsulant 402 is an epoxy molding compound formulated to have a coefficient of thermal expansion (CTE) property which complements the cavity carrier 210. For example, the cavity carrier 210 is formed from a substantially rigid material such as cured epoxy molding compound, glass, quartz, or ceramic, and the formulation of the encapsulant 402 is chosen such that its CTE property allows for curing of the encapsulant 402 without causing significant overall warpage. Accordingly, the encapsulant 402 may be formulated to have a CTE property different from the CTE property of the encapsulant 102 of the cavity carrier 210.

Figure 5:
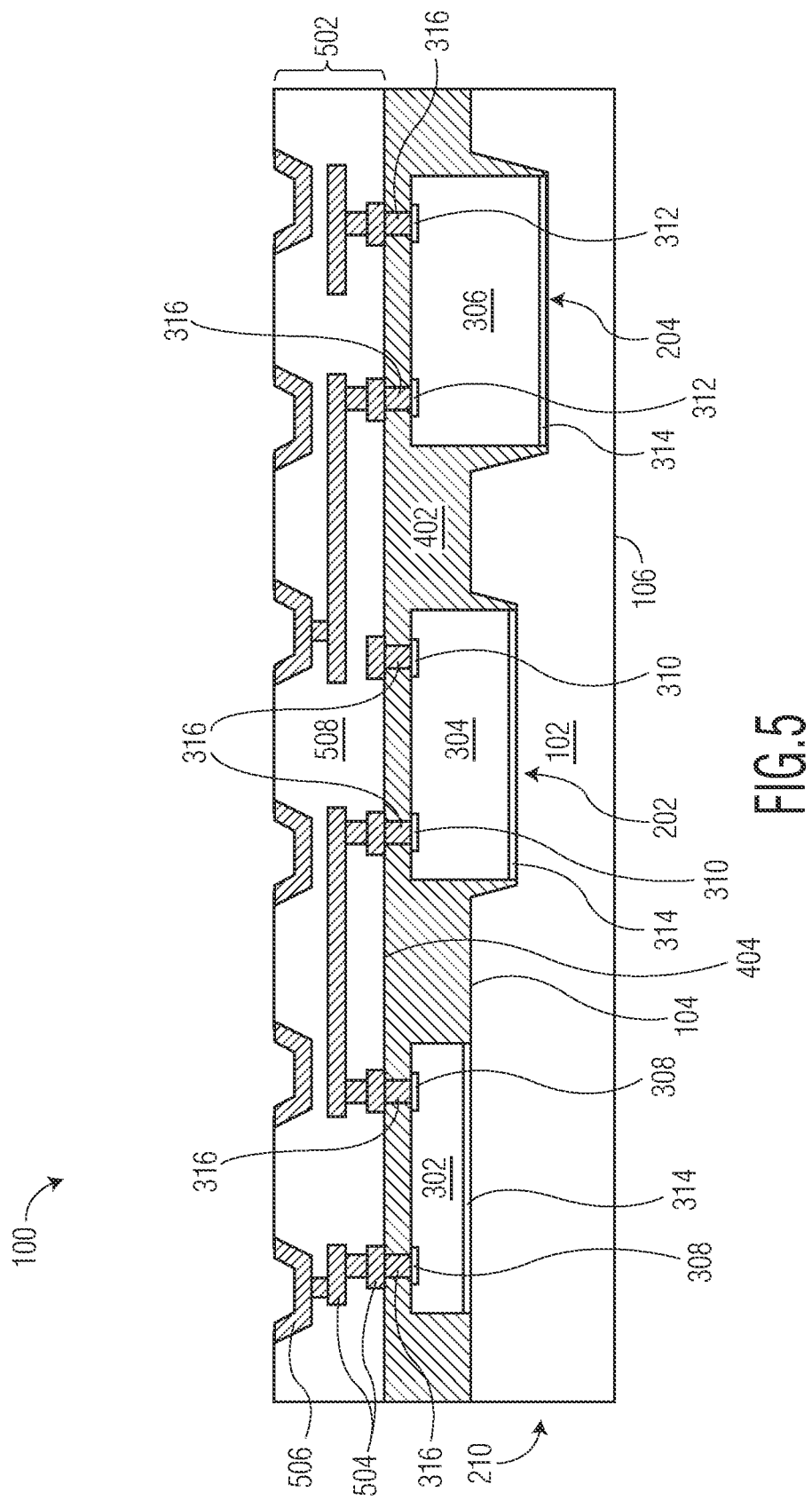

FIG. 5 illustrates, in a simplified bottom-side-up cross-sectional view, the example semiconductor device 100 at a subsequent stage of manufacture in accordance with an embodiment. At this stage of manufacture, the semiconductor device 100 includes an interconnecting package substrate 502 applied to the major side 404 of the dual encapsulated semiconductor device 100. After portions of the conductive die connectors 316 are exposed at the major side 404, the package substrate 502 is applied. The package substrate 502 includes conductive features (e.g., traces 504 and 506) surrounded by non-conductive material 508 (e.g., dielectric). The package substrate 502 may be formed as a build-up substrate directly on the major side 404 of the encapsulant 402 or may be provided as a pre-formed substrate and affixed to the major side 404 of the encapsulant 402.

In this embodiment, the conductive traces 504 and 506 of the package substrate 502 are configured and arranged to interconnect the semiconductor die 302, 304, and 306 with one another and a printed circuit board (PCB), for example. In this embodiment, the conductive traces 506 are formed as under-bump metallization (UBM) structures, for example, configured for attachment of conductive connectors at a subsequent stage of manufacture.

Figure 6:
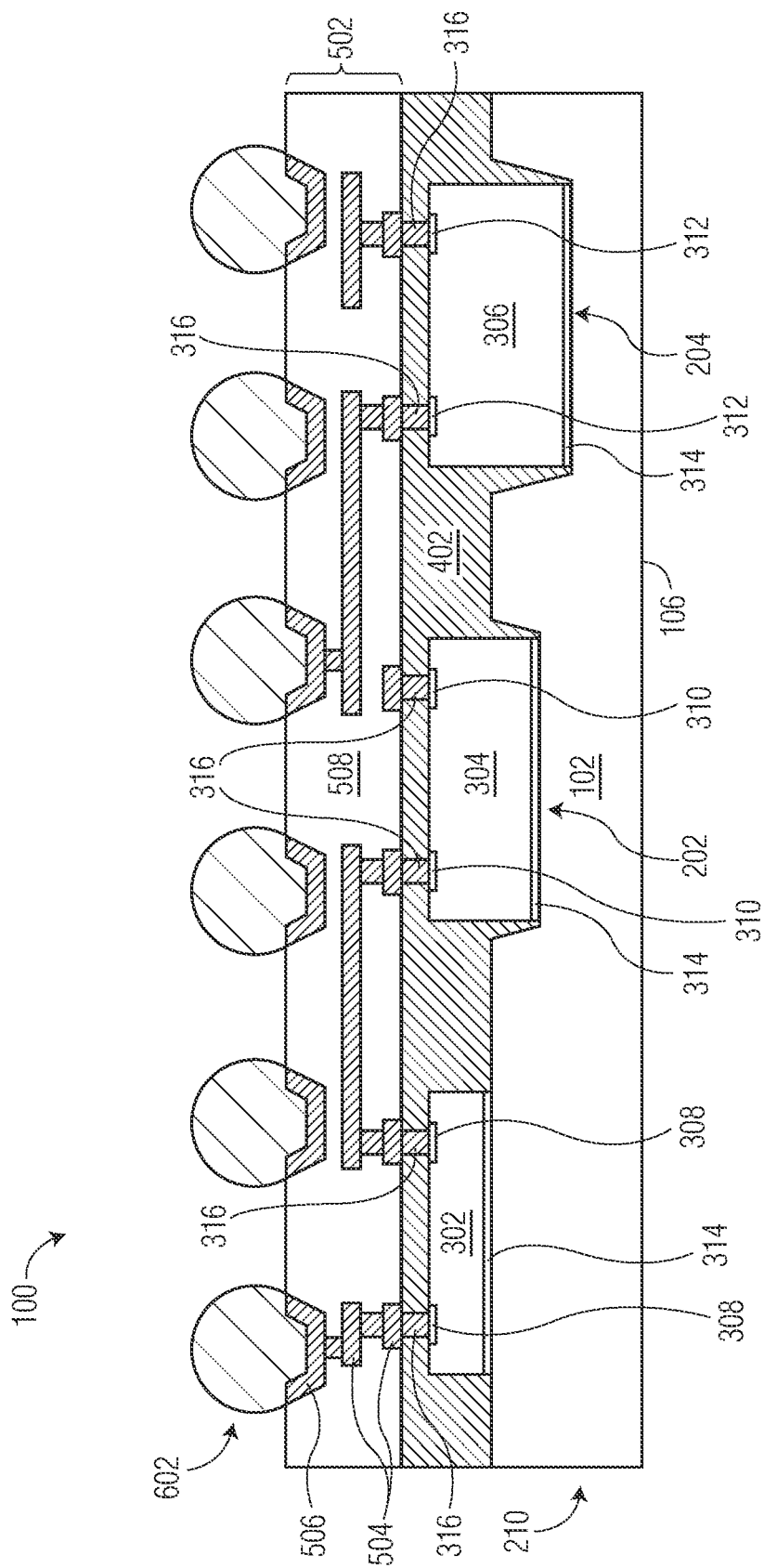

FIG. 6 illustrates, in a simplified bottom-side-up cross-sectional view, the example semiconductor device 100 at a subsequent stage of manufacture in accordance with an embodiment. At this stage of manufacture, the semiconductor device 100 includes conductive connectors 602 (e.g., solder balls) affixed at a bottom side of the package substrate 502. In this embodiment, the conductive connectors 602 are conductively attached to respective conductive traces 506 configured as UBM structures. The conductive connectors 602 are configured and arranged to provide conductive connections between the semiconductor device 100 and a PCB, for example. The conductive connectors 602 may be in the form of any suitable conductive structures such as solder balls, gold studs, copper pillars, and the like, to connect conductive features of the semiconductor device 100 with the PCB. As an alternative to attaching conductive connectors 602, the exposed portions of conductive traces 506 may be plated for subsequent connection with the PCB by way of solder paste attachment or other suitable conductive attachment processes (e.g., ACF, ACP).

Figure 7:
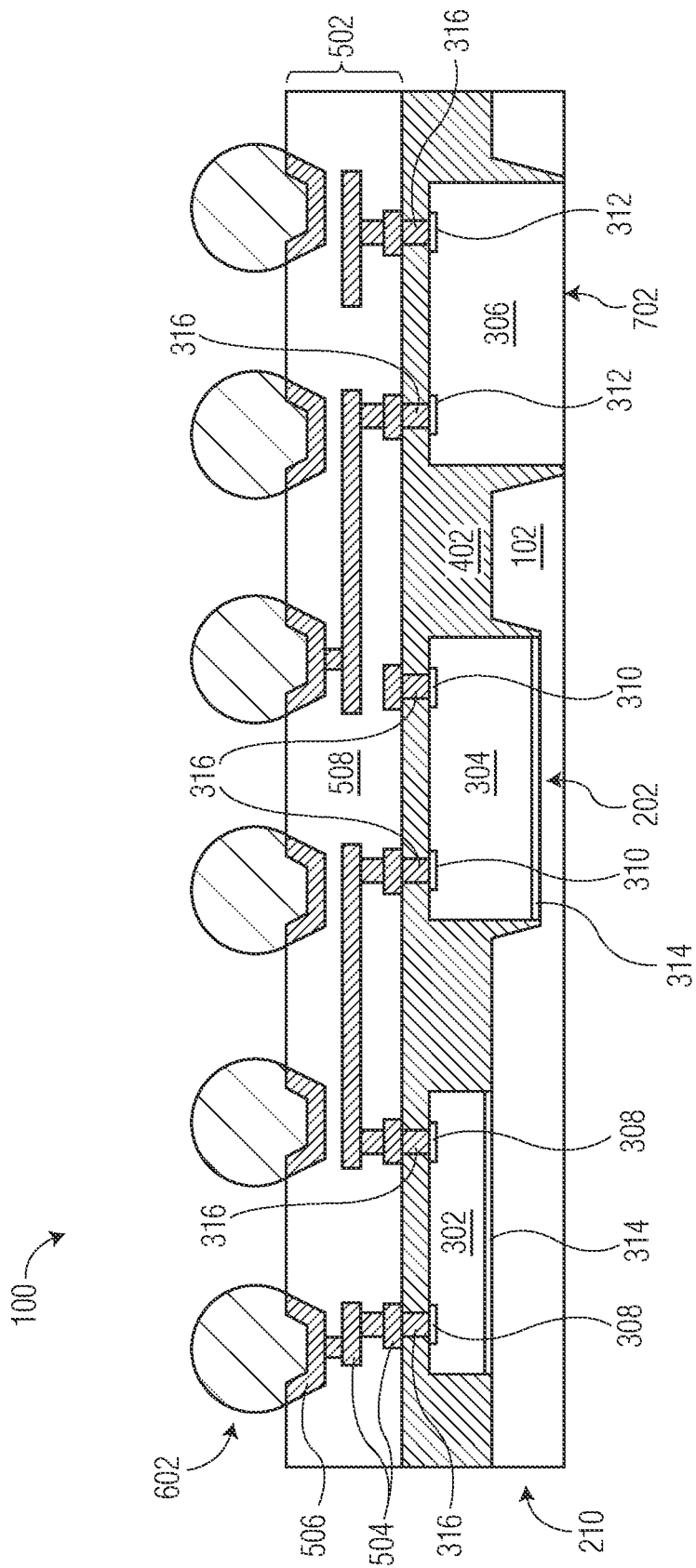

FIG. 7 illustrates, in a simplified bottom-side-up cross-sectional view, the example semiconductor device 100 at a subsequent stage of manufacture in accordance with an embodiment. At this stage of manufacture, the semiconductor device 100 includes the backside of semiconductor die 306 exposed through the cavity carrier 210. In this embodiment, the dual encapsulated semiconductor device 100 is subjected to a grind operation to expose a backside surface 702 of the semiconductor die 306. The second major surface 106 (shown in FIG. 6) of the encapsulant 102 forming the cavity carrier 210 is ground to expose backside surface 702 of the semiconductor die 306. With the backside of the semiconductor die 306 exposed, a heat mitigation structure may be affixed on the exposed backside surface 702. The heat mitigation structure may be in the form of a heat sink or heat spreader and may be attached to the backside surface 702 of the semiconductor die 306 by way of a thermal conductive paste or adhesive, for example.

Generally, there is provided, a method including forming a first cavity at a first major surface of a first encapsulant; affixing a backside of a first semiconductor die on the first major surface of the first encapsulant, the first semiconductor die having a first thickness; affixing a backside of a second semiconductor die on a bottom surface of the first cavity, the second semiconductor die having a second thickness; encapsulating with a second encapsulant the first semiconductor die, the second semiconductor die, and at least exposed portions of the first major surface of the first encapsulant; and forming a package substrate on a first major surface of the second encapsulant, the package substrate including conductive traces interconnected to the first semiconductor die and the second semiconductor die. After the first semiconductor die is affixed on the first major surface of the first encapsulant and the second semiconductor die is affixed on the bottom surface of the first cavity, an active side of the first semiconductor die may be substantially coplanar with an active side of the second semiconductor die. The method may further include forming a first set of die connectors on first die pads of the first semiconductor die; and forming a second set of die connectors on second die pads of the second semiconductor die. The conductive traces may be interconnected to the first semiconductor die and the second semiconductor die respectively by way of the first set and second set of die connectors. The first set of die connectors and the second set of die connectors may be formed as conductive stud bumps. The first semiconductor die may be affixed on the first major surface of the first encapsulant by way of a first die attach adhesive and the second semiconductor die may be affixed on the bottom surface of the first cavity by way of a second die attach adhesive. The method may further include grinding a second major surface of the first encapsulant to expose a backside surface of the second semiconductor die. The first encapsulant may include an epoxy mold compound, glass, quartz, or ceramic material. The second encapsulant may be formulated to have a coefficient of thermal expansion (CTE) different from a CTE of the first encapsulant.

In another embodiment, there is provided, a semiconductor device including a first cavity formed at a first major surface of a first encapsulant; a first semiconductor die affixed on the first major surface of the first encapsulant, the first semiconductor die having a first thickness; a second semiconductor die affixed on a bottom surface of the first cavity, the second semiconductor die having a second thickness, the second thickness greater than the first thickness; a second encapsulant encapsulating the first semiconductor die, the second semiconductor die, and at least exposed portions of the first major surface of the first encapsulant; and a package substrate formed on a first major surface of the second encapsulant, the package substrate including conductive traces interconnected to the first semiconductor die and the second semiconductor die. An active side of the first semiconductor die may be substantially coplanar with an active side of the second semiconductor die. The device may further include a first set of die connectors formed on first die pads of the first semiconductor die; and a second set of die connectors formed on second die pads of the second semiconductor die. The conductive traces of the package substrate may be interconnected to the first semiconductor die and the second semiconductor die respectively by way of the first set and second set of die connectors. The first set of die connectors and the second set of die connectors may be formed as conductive stud bumps. A plurality of conductive connectors may be affixed to the package substrate, the conductive connectors configured for attachment to a printed circuit board.

In yet another embodiment, there is provided, a method including forming a first cavity at a first major surface of a first encapsulant; affixing a backside of a first semiconductor die on the first major surface of the first encapsulant, the first semiconductor die having a first thickness; affixing a backside of a second semiconductor die on a bottom surface of the first cavity, the second semiconductor die having a second thickness, the second thickness greater than the first thickness; encapsulating with a second encapsulant the first semiconductor die, the second semiconductor die, and at least exposed portions of the first major surface of the first encapsulant; and forming a package substrate on a first major surface of the second encapsulant, the package substrate including conductive traces interconnected to the first semiconductor die and the second semiconductor die. The method may further include forming a first set of die connectors on first die pads of the first semiconductor die; and forming a second set of die connectors on second die pads of the second semiconductor die. The conductive traces may be interconnected to the first semiconductor die and the second semiconductor die respectively by way of the first set and second set of die connectors. The first set of die connectors and the second set of die connectors may be formed as conductive stud bumps. After the first semiconductor die is affixed on the first major surface of the first encapsulant and the second semiconductor die is affixed on the bottom surface of the first cavity, an active side of the first semiconductor die may be substantially coplanar with an active side of the second semiconductor die.

By now, it should be appreciated that there has been provided a multi-die semiconductor device with a cavity carrier. The semiconductor device includes a plurality of semiconductor die encapsulated by way of a dual encapsulation process. A first encapsulant of the dual encapsulation process is formed from a substantially rigid material such as a cured epoxy molding compound, glass, quartz, or ceramic. One or more cavities are formed in the first encapsulant creating a die cavity carrier. The one or more cavities serve as die attachments sites along with a die attachment site located at the major surface of the cavity carrier. Each of the one or more cavities is formed to a predetermined depth such that after a plurality of semiconductor die are attached to respective die attachment sites, active surfaces of the of the plurality of semiconductor die are substantially coplanar. A second encapsulant of the dual encapsulation process encapsulates the plurality of semiconductor die and exposed portions of the first encapsulant of the cavity carrier. Here, the second encapsulant together with the first encapsulant provide a dual encapsulation encasing the plurality of semiconductor die. Conductive die connectors attached to die pads of the plurality of semiconductor die are expose through the second encapsulant by way of a grind operation. An interconnecting package substrate is applied on the second encapsulant and conductively connected the exposed die connectors. By forming the semiconductor device in this manner, a plurality of semiconductor die with various thickness can be accommodated.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of forming a semiconductor device, the method comprising:
    forming a first cavity at a first major surface of a first encapsulant;
    affixing a backside of a first semiconductor die on the first major surface of the first encapsulant, the first semiconductor die having a first thickness;
    affixing a backside of a second semiconductor die on a bottom surface of the first cavity, the second semiconductor die having a second thickness;
    encapsulating with a second encapsulant the first semiconductor die, the second semiconductor die, and at least exposed portions of the first major surface of the first encapsulant; and
    forming a package substrate on a first major surface of the second encapsulant, the package substrate including conductive traces interconnected to the first semiconductor die and the second semiconductor die.

2. The method of claim 1, wherein after the first semiconductor die is affixed on the first major surface of the first encapsulant and the second semiconductor die is affixed on the bottom surface of the first cavity, an active side of the first semiconductor die is substantially coplanar with an active side of the second semiconductor die.

3. The method of claim 1, further comprising:
    forming a first set of die connectors on first die pads of the first semiconductor die; and
    forming a second set of die connectors on second die pads of the second semiconductor die.

4. The method of claim 3, wherein the conductive traces are interconnected to the first semiconductor die and the second semiconductor die respectively by way of the first set and second set of die connectors.

5. The method of claim 3, wherein the first set of die connectors and the second set of die connectors are formed as conductive stud bumps.

6. The method of claim 1, wherein the first semiconductor die is affixed on the first major surface of the first encapsulant by way of a first die attach adhesive and the second semiconductor die is affixed on the bottom surface of the first cavity by way of a second die attach adhesive.

7. The method of claim 1, further comprising grinding a second major surface of the first encapsulant to expose a backside surface of the second semiconductor die.

8. The method of claim 1, wherein the first encapsulant includes an epoxy mold compound, glass, quartz, or ceramic material.

9. The method of claim 1, wherein the second encapsulant is formulated to have a coefficient of thermal expansion (CTE) different from a CTE of the first encapsulant.

10. A semiconductor device comprising:
    a first cavity formed at a first major surface of a first encapsulant;
    a first semiconductor die affixed on the first major surface of the first encapsulant, the first semiconductor die having a first thickness;
    a second semiconductor die affixed on a bottom surface of the first cavity, the second semiconductor die having a second thickness, the second thickness greater than the first thickness;
    a second encapsulant encapsulating the first semiconductor die, the second semiconductor die, and at least exposed portions of the first major surface of the first encapsulant; and
    a package substrate formed on a first major surface of the second encapsulant, the package substrate including conductive traces interconnected to the first semiconductor die and the second semiconductor die.

11. The device of claim 10, wherein an active side of the first semiconductor die is substantially coplanar with an active side of the second semiconductor die.

12. The device of claim 10, further comprising:
    a first set of die connectors formed on first die pads of the first semiconductor die; and
    a second set of die connectors formed on second die pads of the second semiconductor die.

13. The device of claim 12, wherein the conductive traces of the package substrate are interconnected to the first semiconductor die and the second semiconductor die respectively by way of the first set and second set of die connectors.

14. The device of claim 12, wherein the first set of die connectors and the second set of die connectors are formed as conductive stud bumps.

15. The device of claim 10, wherein a plurality of conductive connectors are affixed to the package substrate, the conductive connectors configured for attachment to a printed circuit board.

16. A method of forming a semiconductor device, the method comprising:
- forming a first cavity at a first major surface of a first encapsulant;
- affixing a backside of a first semiconductor die on the first major surface of the first encapsulant, the first semiconductor die having a first thickness;
- affixing a backside of a second semiconductor die on a bottom surface of the first cavity, the second semiconductor die having a second thickness, the second thickness greater than the first thickness;
- encapsulating with a second encapsulant the first semiconductor die, the second semiconductor die, and at least exposed portions of the first major surface of the first encapsulant; and
- forming a package substrate on a first major surface of the second encapsulant, the package substrate including conductive traces interconnected to the first semiconductor die and the second semiconductor die.

17. The method of claim 16, further comprising:
- forming a first set of die connectors on first die pads of the first semiconductor die; and
- forming a second set of die connectors on second die pads of the second semiconductor die.

18. The method of claim 17, wherein the conductive traces are interconnected to the first semiconductor die and the second semiconductor die respectively by way of the first set and second set of die connectors.

19. The method of claim 17, wherein the first set of die connectors and the second set of die connectors are formed as conductive stud bumps.

20. The method of claim 16, wherein after the first semiconductor die is affixed on the first major surface of the first encapsulant and the second semiconductor die is affixed on the bottom surface of the first cavity, an active side of the first semiconductor die is substantially coplanar with an active side of the second semiconductor die.

* * * * *